(12) United States Patent
Beach et al.

(10) Patent No.: US 7,202,533 B1
(45) Date of Patent: Apr. 10, 2007

(54) THIN FILM RESISTORS INTEGRATED AT A SINGLE METAL INTERCONNECT LEVEL OF DIE

(75) Inventors: Eric W. Beach, Tucson, AZ (US); Vladimir F. Drobny, Tucson, AZ (US); Derek W. Robinson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/239,253

(22) Filed: Sep. 29, 2005

(51) Int. Cl.
*H01L 23/62* (2006.01)

(52) U.S. Cl. .................. 257/363; 257/358; 257/516; 257/E27.016; 257/E27.035; 257/E27.047; 438/358; 438/384

(58) Field of Classification Search .............. 257/363, 257/516, 358, E27.016, E27.035, E27.47; 438/384, 385
See application file for complete search history.

(56) References Cited

U.S. PATENT DOCUMENTS 4,019,168 A    4/1977   Collins ................. 338/309
5,976,944 A *  11/1999  Czagas et al. .............. 438/382

\* cited by examiner

*Primary Examiner*—George Fourson
*Assistant Examiner*—Julio J. Maldonado
(74) *Attorney, Agent, or Firm*—W. James Brady, III; Frederick J. Telecky, Jr.

(57) ABSTRACT

An integrated circuit structure includes a first dielectric layer disposed on a semiconductor layer, a first thin film resistor disposed on the first dielectric layer, a second dielectric layer disposed on the first dielectric layer and the first thin film resistor, and a second thin film resistor disposed on the second dielectric layer. A first layer of interconnect conductors is disposed on the second dielectric layer and includes a first interconnect conductor contacting a first contact area of the first thin film resistor, a second interconnect conductor contacting a second contact area of the first thin film resistor, and a third interconnect conductor electrically contacting a first contact area of the second thin film resistor. A third dielectric layer is disposed on the second dielectric layer. A second layer of interconnect conductors is disposed on the third dielectric layer including a fourth interconnect conductor for contacting the second interconnect conductor. A fifth interconnect conductor of the first layer of interconnect conductors contacts the circuit element.

12 Claims, 5 Drawing Sheets

THIN FILM RESISTORS INTEGRATED AT A SINGLE METAL INTERCONNECT LEVEL OF DIE

BACKGROUND OF THE INVENTION

The present invention relates generally to practical thin film resistor structures and methods for integrating multiple thin film resistors of the same or different materials and/or sheet resistances which can be contacted by conductors of a single layer of interconnect metallization.

In the past, integrated circuit designers have been limited to one sheet resistance for the thin film resistors integrated into a particular chip. This has necessitated design compromises, especially in the case of high resistance laser trimmed resistors, because in this case the resistors usually are quite narrow. Consequently, the minimum trimmable amount of resistance is a greater proportion of the total resistance, so the accuracy is substantially less for laser trimmed high value resistors unless their width is substantially increased. Also, if the single available sheet resistance is high but the circuit designer needs to provide a low value precision resistor, then the resistor must be made very wide.

It is conventional to adjust the sheet resistance, and also the temperature coefficient of resistance (TCR), of a resistive thin film layer by using suitable thermal anneal cycles to achieve a target sheet resistance for a deposited NiCr or SiCr layer. Once the sheet resistance of a thin film layer is known, the amount of annealing needed to increase its sheet resistance and TCR to target values can be determined from empirical curves.

A typical substrate on which an integrated circuit thin film resistor is formed includes a silicon wafer on which a field oxide is formed. An intrinsic TEOS layer (tetra ethyl ortho silicate layer, which is the liquid precursor used to form the oxides) is formed on the field oxide. A BPTEOS (boron phosphorus doped oxide) layer is formed on the TEOS layer. Another TEOS layer is formed on the BPTEOS layer to keep the doping away from interconnect metallization. The doping referred to is used to lower the re-flow temperature, which improves planarization, and reduces the sharpness of the edges of the oxide steps in the structure. The doping also provides gettering of sodium to keep it and other contaminants away from the transistors previously formed in the silicon substrate. The doping also has been proven to be beneficial in mitigating field oxide threshold problems, thereby preventing parasitic MOS field devices from turning on. The doping also helps in preventing charge-spreading, wherein the field threshold voltage gradually degrades, causing the parasitic MOS field devices eventually to begin to turn on and degrade circuit performance.

Design engineers would be able to better optimize some integrated circuit designs if it were practical and economical to integrate thin film resistors of various sheet resistances into a single integrated circuit structure. However, there has been no practical, economical way to accomplish this because temperature processing cycles associated with forming subsequent thin film resistor layers after formation of a first thin film resistor layer would cause a variety of difficult integrated circuit processing problems. For example, controlling the effect of various thermal cycles on the sheet resistances and TCRs of the multiple thin film resistors formed on the same or successive oxide layers may be very difficult. Also, the presence of metallization layers in integrated structures including thin film resistors on multiple layers may make it very difficult to design subsequent thermal cycles of the kind needed to be compatible with the thin film resistor properties.

U.S. Pat. No. 4,019,168 entitled "Bilayer of Thin Film Resistor and Method for Manufacture", issued Apr. 19, 1977 to Franklyn M. Collins, describes an integrated circuit structure including a layer of tantalum on a layer of nichrome for the purpose of stabilizing the sheet resistance of the nichrome. However, the foregoing patent is not directed to issues regarding processing problems associated with forming multiple thin film resistors on the same or different oxide layers in an integrated circuit structure.

Prior art structures that include interconnected polycrystalline silicon resistors and diffused resistors are well known. However, such structures including polycrystalline silicon resistors and diffused resistors do not meet many of the needs of modern integrated circuit design. Although it is highly desirable to provide a TCR value of zero for polycrystalline silicon resistors and diffused resistors, as a practical matter this is difficult to achieve to achieve. In contrast, it is relatively easy to achieve a TCR value of zero in thin film resistors for most sheet resistances. Diffused resistors have high voltage coefficients, due to their associated voltage-dependent depletion regions which cause the resistance to change as a function of voltage applied across the diffused resistor. Also, high precision resistance values and precise ratio-matching are much more difficult to achieve for polycrystalline resistors and diffused resistors than is the case for thin film resistors.

In some cases, it would be desirable to be able to integrate resistors of different materials and/or different sheet resistances into a single integrated structure in which all of the resistors can be contacted by conductors of a single interconnect metallization layer.

There is an unmet need for a practical integrated circuit structure and method for providing different thin film resistors composed of different materials of different sheet resistances into a single integrated structure in which all of the resistors can be contacted by conductors of a single interconnect metallization layer.

There also is an unmet need for a practical integrated circuit structure and method for providing different thin film resistors composed of different materials of different sheet resistances into a single integrated structure in which all of the resistors can be contacted by conductors of a single interconnect metallization layer, and wherein the sheet resistance of one of the thin film resistors can be adjusted without unacceptably changing the sheet resistance of the other thin film resistor.

There also is an unmet need for a practical integrated circuit structure and method for providing different thin film resistors composed of the same or different materials of different sheet resistances into a single integrated structure in which all of the resistors can be contacted by conductors of a single interconnect metallization layer which can be any interconnect metallization layer of the integrated circuit structure.

SUMMARY OF THE INVENTION

It is an object of the invention to provide a practical integrated circuit structure and method for providing different thin film resistors composed of the same or different materials of different sheet resistances into a single integrated structure in which all of the resistors can be contacted by conductors of a single interconnect metallization layer.

It is another object of the invention to provide a practical integrated circuit structure and method for providing different thin film resistors composed of the same or different materials of different sheet resistances into a single integrated structure in which all of the resistors can be contacted by conductors of a single interconnect metallization layer, and wherein the sheet resistance of one of the thin film resistors can be adjusted without unacceptably changing the sheet resistance of the other thin film resistor.

It is another object of the invention to provide a practical integrated circuit structure and method for providing different thin film resistors composed of the same or different materials of different sheet resistances into a single integrated structure in which all of the resistors can be contacted by conductors of a single overlying interconnect metallization layer which can be any interconnect metallization layer of the integrated circuit structure.

It is another object of the invention to provide a practical integrated circuit structure and method for providing different thin film resistors composed of the same or different materials of different sheet resistances into a single integrated structure previously provided by an integrated circuit foundry, wherein all of the resistors can be contacted by conductors of a single overlying interconnect metallization layer which can be any interconnect metallization layer of the integrated circuit structure.

Briefly described, and in accordance with one embodiment, the present invention provides an integrated circuit structure including a first dielectric layer (2) disposed on a semiconductor layer (8), a first thin film resistor (10) disposed on the first dielectric layer (2), a second dielectric layer (12) disposed on the first dielectric layer (2) and the first thin film resistor (10), and a second thin film resistor (3) disposed on the second dielectric layer (12). A first layer (Metal 1) of interconnect conductors (5A,5B,5C) is disposed on the second dielectric layer (12) and includes a first interconnect conductor (5A) contacting a first contact area of the first thin film resistor (10), a second interconnect conductor (5B) contacting a second contact area of the first thin film resistor (10), and a third interconnect conductor (5C) electrically contacting a first contact area of the second thin film resistor (2). A third dielectric layer (7) is disposed on the second dielectric layer (12). A second layer (Metal 2) of interconnect conductors (23,24) is disposed on the third dielectric layer (7) including a fourth interconnect conductor (23) for contacting the second interconnect conductor (5B).

In one embodiment, the integrated circuit structure includes a first dielectric layer (2) disposed on a semiconductor layer (8), a first thin film resistor (10) disposed on the first dielectric layer (2), a second dielectric layer (12) disposed on the first dielectric layer (2) and the first thin film resistor (10), and a second thin film resistor (3) disposed on the second dielectric layer (12). A first layer (Metal 1) of interconnect conductors (5A,5B,5C) is disposed on the second dielectric layer (12) and includes a first interconnect conductor (5A) contacting a first contact area of the first thin film resistor (10) through a corresponding via opening (14), a second interconnect conductor (5B) contacting a second contact area of the first thin film resistor (10) through a corresponding via opening (14), and a third interconnect conductor (5C) electrically contacting a first contact area of the second thin film resistor (3). A third dielectric layer (7) is disposed on the second dielectric layer (12), the first layer of interconnect conductors, and the second thin film resistor (3), and a second layer (Metal 2) of interconnect conductors (23,24) is disposed on the third dielectric layer (7) including a fourth interconnect conductor (23) extending through a corresponding opening (16,18) in the third (7) dielectric layer to contact the second interconnect conductor (5B). In one embodiment, a circuit element (6) is disposed in the semiconductor layer (8), and a fifth interconnect conductor of the first layer (Metal 1) of interconnect conductors extends through a corresponding opening (11A, 11B) in the first (2) and second (12) dielectric layers and contacts a contact area of the circuit element (6). The first thin film resistor (10) can be composed of sichrome and the second thin film resistor (3) can be composed of nichrome. A metal silicide layer (15) is disposed between the fifth interconnect conductor and the contact area of the circuit element (6).

DETAILED DESCRIPTION OF THE PREFERRED EMBODIMENTS

FIGS. 1–10 illustrate a sequence of diagrams of an integrated circuit structure 1 illustrating formation of the final integrated circuit structure shown in 10 as a result of a number of processing operations according to the invention. The present invention provides a practical integrated circuit structure and method for providing different thin film resistors composed of the same or different materials of different sheet resistances into a single integrated structure in which all of the resistors can be contacted by conductors of a single interconnect metallization layer, and wherein the sheet resistance of one of the thin film resistors can be readily adjusted during manufacture without unacceptably changing the sheet resistance of the other thin film resistor.

Figure 1:
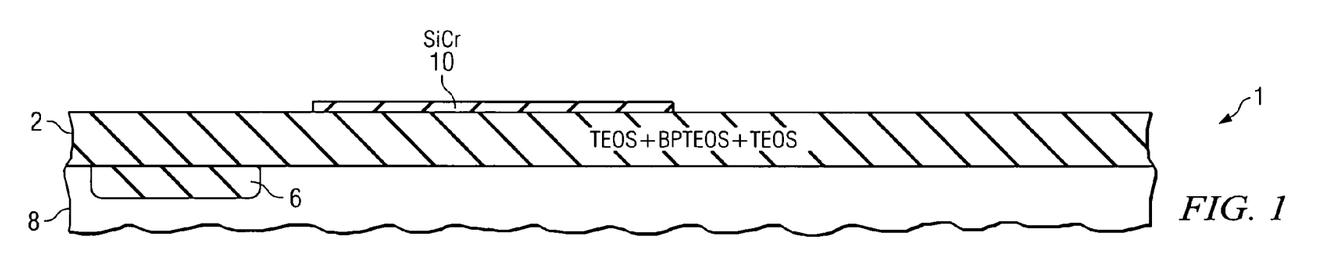
FIGS. 1–10 schematically illustrate 10 intermediate structures 1 that are successively produced by a sequence of successive process steps in the formation of a thin film resistor structure that can be formed at the same time as a back end capacitor of the present invention.

FIG. 1 shows a preliminary integrated circuit substructure 1 including a silicon layer 8, which typically has formed therein various circuit components 6. Silicon layer 8 may be an epitaxial layer formed on a silicon substrate (not shown). A typical field oxide (not shown) also is present on the preliminary integrated circuit substructure shown in FIG. 1. A standard pre-metal dielectric layer 2 has been deposited on the foregoing preliminary substructure. Circuit components 6 may include active circuit components such as transistors and passive circuit components such as diffused/implanted resistors. Pre-metal dielectric layer 2 includes a TEOS (tetraethylorthosilicate) layer on the above-mentioned substructure, a BPTEOS (Boron-Phosphorus TEOS) layer on the first TEOS sublayer, and a second TEOS layer on the BPTEOS sublayer.

As also indicated in FIG. 1, a thin (e.g., 38 Angstrom) sichrome film resistor layer 10 then is deposited on intermetal dielectric layer 7. Conventional photolithography steps and a dry etch step are performed to define the size and shape of a sichrome resistor 10.

Figure 2:
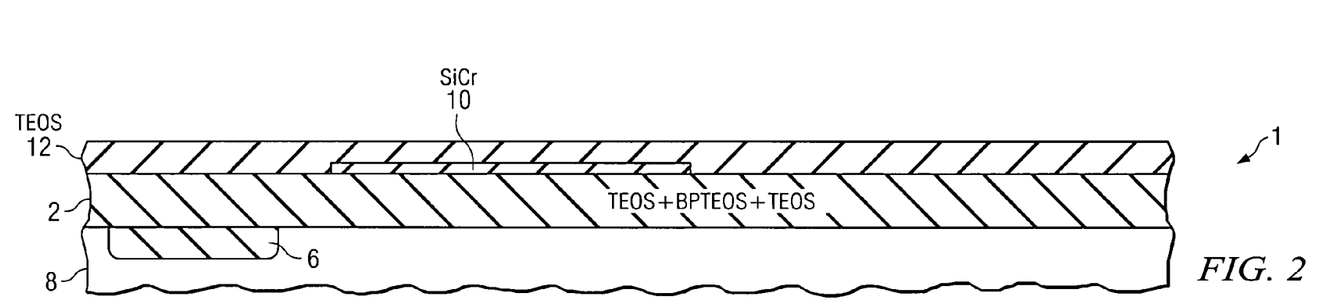

Referring to FIG. 2, a very thin (e.g., about 1000 to 2000 Angstroms) TEOS layer 12 then is deposited on the structure to act as an etch stop against an etchant used in the subsequently mentioned Metal 2 etching procedure in order to protect sichrome resistor 10. This prevents sichrome layer 10 from being exposed to any harmful ambient gas during the anneal due, for example, to imperfections in the anneal chamber, and therefore prevents any accidental oxidation of sichrome resistor material and hence results in improved accuracy of sichrome resistor 10 by serving as a barrier between the resistor material and the ambient atmosphere in the anneal chamber.

A nitrogen or argon anneal process then can be performed, for example at a temperature of 470 degrees Centigrade for a period of 30 minutes, to lower the sichrome sheet resistance from, for example, about 1150 ohms per square to about 1000 ohms per square and to adjust the TCR, wherein the nitrogen or argon prevent oxide formation and associated contact resistance. Note, however, that the sheet resistance of sichrome layer 10 can be in the range from 300 to 3000 ohms per square.

The sheet resistance of first-deposited sichrome resistor 10 typically is much higher than that of second-deposited NiCr resistor 3. The sichrome layer typically is annealed to decrease its sheet resistance and to increase its TCR to desired target values. Preferably, however, the high-sheet-resistance, first-deposited sichrome layer 10 is deposited with a high precision sheet resistance value and does not require annealing. It should be appreciated that if the nichrome layer 3 were to be annealed at a high temperature for a long duration, that might result in difficult-to-control changes in the sheet resistance (and TCR) of the previously-deposited SiCr layer 10. In any case, sichrome resistor 10 typically is a high precision resistor having a sheet resistance near 1000 ohms per square (although it could be in the above-mentioned range of approximately 300–2000 ohms per square), with a TCR of approximately 0 parts per million (ppm).

Figure 3:
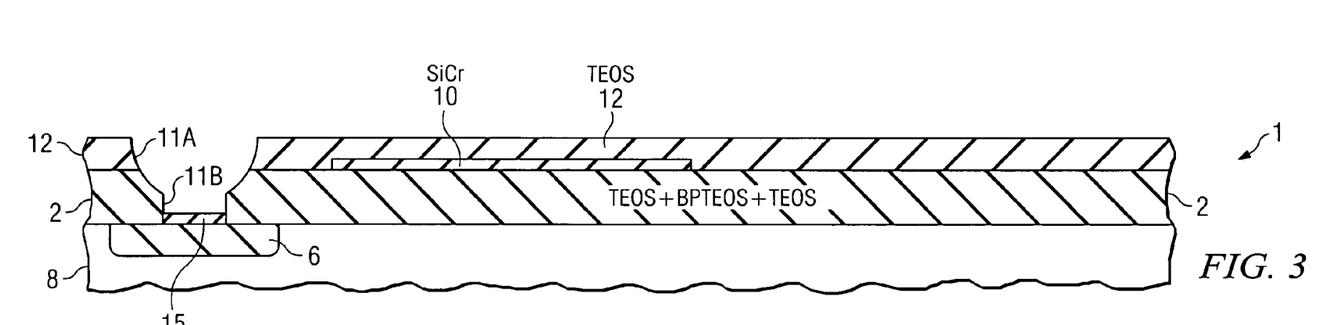

In FIG. 3, a contact opening 11A,11B extending through pre-metal dielectric layer 2 and TEOS layer 12 is formed using a two-part etching procedure, using a single mask. (An opening through a dielectric layer to allow subsequently deposited metallization to contact a silicon electrode is commonly referred to as a "contact opening", whereas an opening through a dielectric layer to contact another metal layer or a thin film resistor is commonly referred to as a "via opening". However, the term "contact opening" may encompass both types of openings.) The first part is an isotropic etch which forms a somewhat rounded portion 11A of the contact opening, as shown. The second part of the contact opening etching procedure is formed by an anisotropic etch which forms the "stem" portion 11B of the contact opening.

Then a layer 15 of vanadium is formed on the bottom of the contact opening 11A,11B for the purpose of forming vanadium silicide by means of a conventional deposition, anneal, and stripping technique, to provide good contact to the silicon electrode in region 6.

Figure 4:
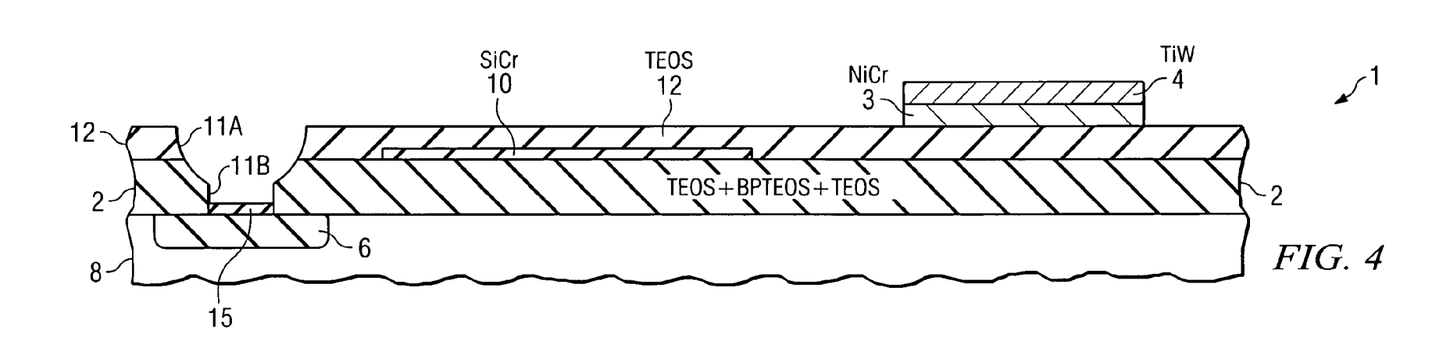

Referring to FIG. 4, a thin layer 10 of nichrome (NiCr or NiCrAl or other nichrome alloy) having a sheet resistance typically in the range from 30 to 300 ohms per square is deposited on the upper surface of oxide layer 12. A thin layer of titanium-tungsten 4 then is deposited on NiCr resistor 3. The mask images of the nichrome and titanium-tungsten layers are simultaneously imaged onto the integrated circuit prior to the depositions of the nichrome and the titanium-tungsten. The nichrome resistor sizes and shapes have been determined by a titanium-tungsten/nichrome etching process. Dielectric (e.g., titanium nitride, not shown) is deposited over the structure to protect it from the etchant subsequently utilized to pattern the subsequently described Metal 1 layer.

Figure 5:
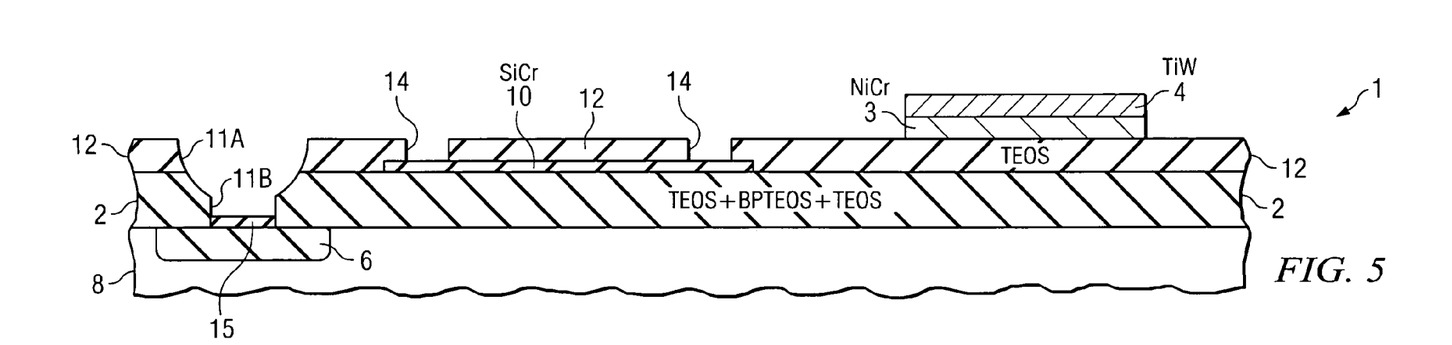

Referring to FIG. 5, in the next step a photoresist and etching procedure is performed to define the various via openings 14 to expose contact areas of sichrome resistors such as resistor 10.

Figure 6:
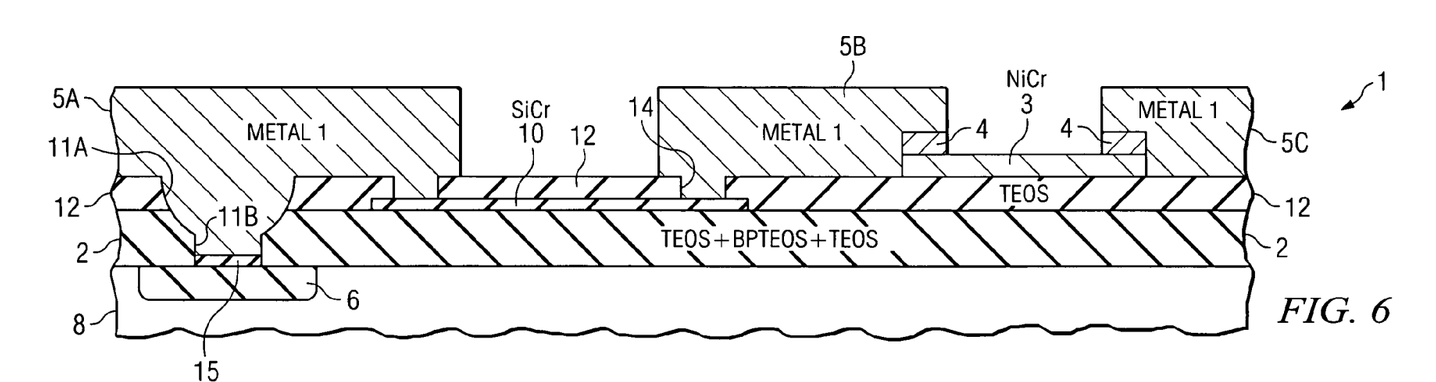

Referring to FIG. 6, the "Metal 1" layer, which can be composed of aluminum with 0.5% copper, is deposited, followed by conventional photolithography to define the sizes and shapes of various aluminum conductors, for example, conductors 5A–5C, wherein first a chlorinated plasma etches portions of the aluminum metal to define the shapes of conductors 5A–5C. Then the etching plasma is switched from chlorinated plasma to fluorinated plasma which etches away the titanium-tungsten over the body of the NiCr resistor 3 other than the metal contact areas 4A between metal conductors 5B and 5C and the contact areas at the ends of NiCr resistor 3. The fluorine in the plasma displaces any chlorine, which prevents subsequent corrosion that otherwise could be caused by remaining chlorine. (For simplicity, some of the detailed structural features resulting from steps associated with the Metal 1 deposition procedure are not shown. For example, titanium-tungsten and then a thin layer of oxide are deposited on top of the aluminum metallization to prevent the aluminum metallization from oxidizing during subsequent annealing of nichrome resistor 3.)

Some of the conductors of the Metal 1 layer, such as conductor 5A, extend through the contact openings 11A,11B in pre-metal dielectric layer 2 and TEOS layer 12 to contact electrodes of circuit elements in silicon layer 8, such as circuit element 6. Other Metal 1 conductors, such as conductors 5B and 5C, make good electrical contact to the small end portions of titanium-tungsten layer 4, respectively, which remain on the contact areas at the ends of nichrome resistor 3. Some conductors, such as conductors 5A and 5B, make electrical contact through contact openings 14 to the contact areas of sichrome resistors such as sichrome resistor 10.

After the Metal 1 layer conductors 5A–5C are formed, an anneal operation is performed, partly in forming gas and partly in oxygen. This annealing increases the sheet resistance of nichrome resistor 3 from, for example, about 37 ohms per square to about 50 ohms per square, and also establishes a desired TCR value according to annealing curves that have been established for the particular nichrome deposition process being utilized. (The foregoing anneal operation would have minimal effect on the sheet resistance of sichrome layer 10 because the temperature of the anneal is only 400 degrees Centigrade, whereas the critical temperature at which the anneal would cause an appreciable change in the sichrome sheet resistance is about 470 degrees Centigrade.) Conventional rapid thermal anneal (RTA) technology or conventional tube annealing can be used to accomplish the annealing cycle.

Figure 7:
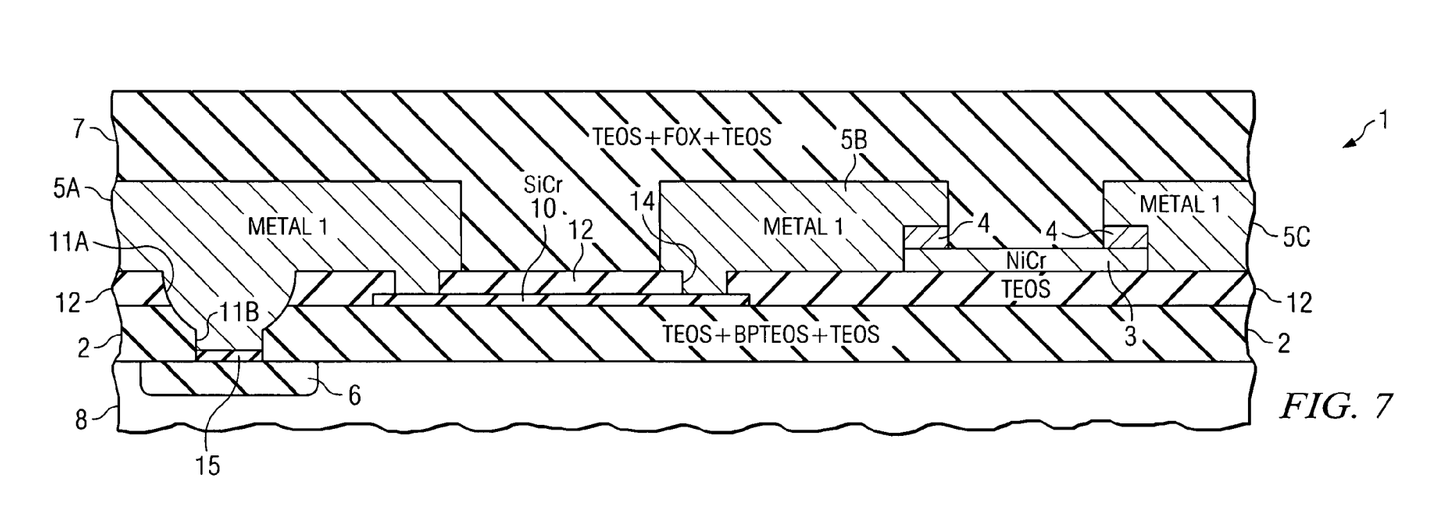

Referring to FIG. 7, an inter-metal dielectric layer 7 is formed on the exposed substructure surface area including the exposed area of the thin TEOS layer 12, the Metal 1 conductors 5A–5C, the exposed area of nichrome resistor 3, and the exposed nichrome. Inter-metal dielectric layer 7 is formed by first depositing a plasma-enhanced TEOS sublayer, followed by a application of a flowable spin-on oxide (trademark FOx), which helps to planarize the integrated circuit chip surface. Then the structure of FIG. 7 is annealed in the presence of nitrogen gas or other suitable ambient, followed by another plasma-enhanced TEOS layer. (The trademark FOx refers to "flowable oxide", belongs to Dow Corning, and is composed of hydrogen silsesquioxane ($HSiO_{3/2}$).

Figure 8:
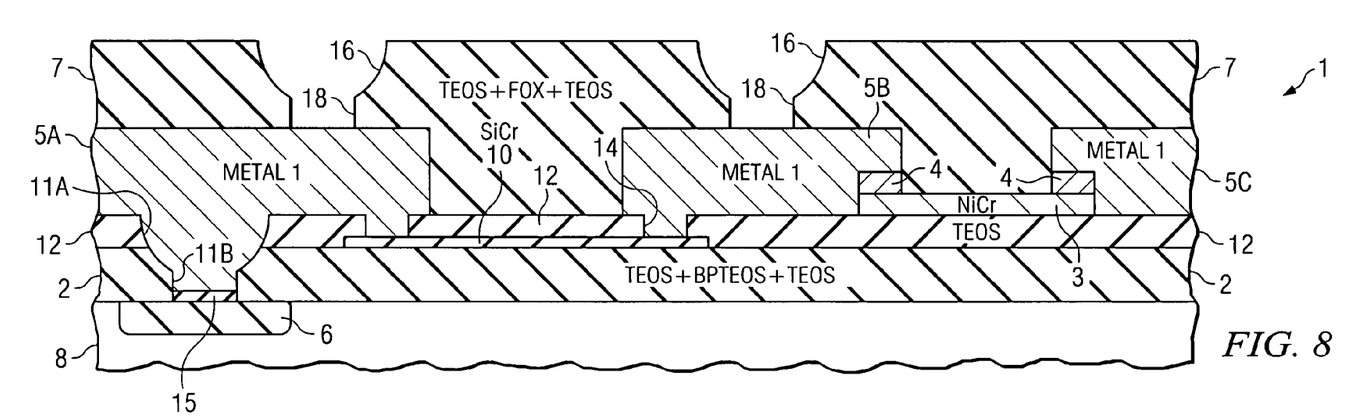

Referring to FIG. 8, the above-mentioned two-part etching procedure is used to form via openings 16 and 18 through the upper and lower portions, respectively, of intermetal dielectric layer 7 to the various Metal 1 conductors 5A–5C.

Figure 9:
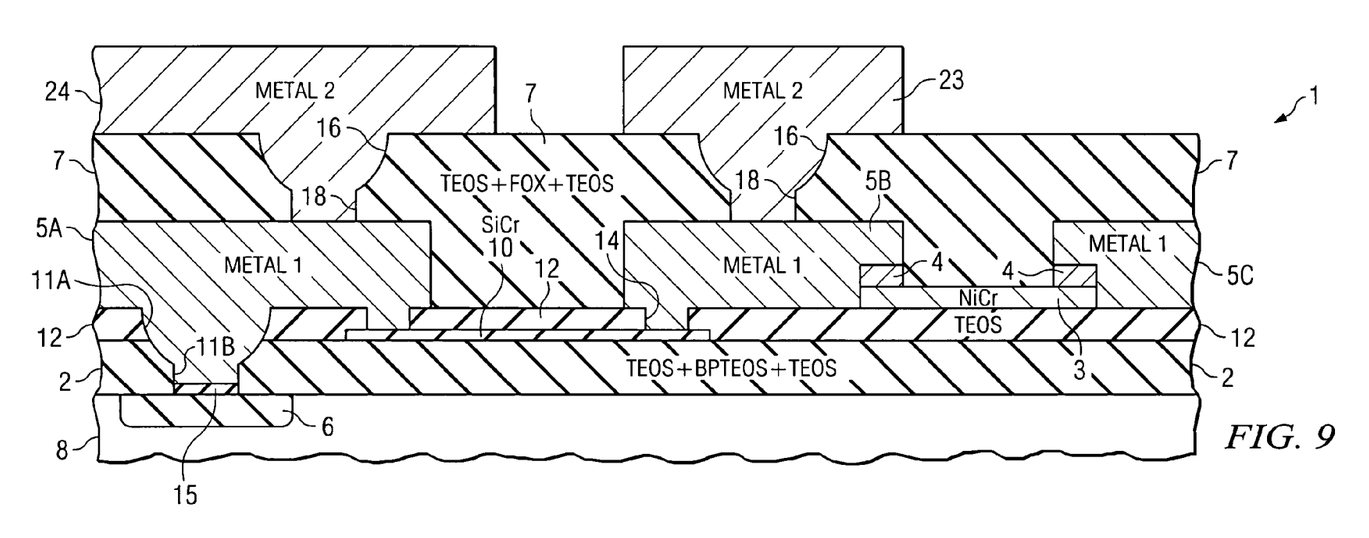

Next, as shown in FIG. 9, a "Metal 2" metallization layer including conductors 23 and 24 is deposited on the exposed wafer surface, extending through the via openings 16,18 to electrically contact the exposed surfaces of Metal 1 conductors such as conductors 5A and 5B, respectively. A photoresist and etching procedure defines the sizes and shapes of the Metal 2 conductors 23 and 24 and results in the structure shown in FIG. 9. (The Metal 1 and Metal 2 layers do not need to be of the same composition or thickness.)

Figure 10:
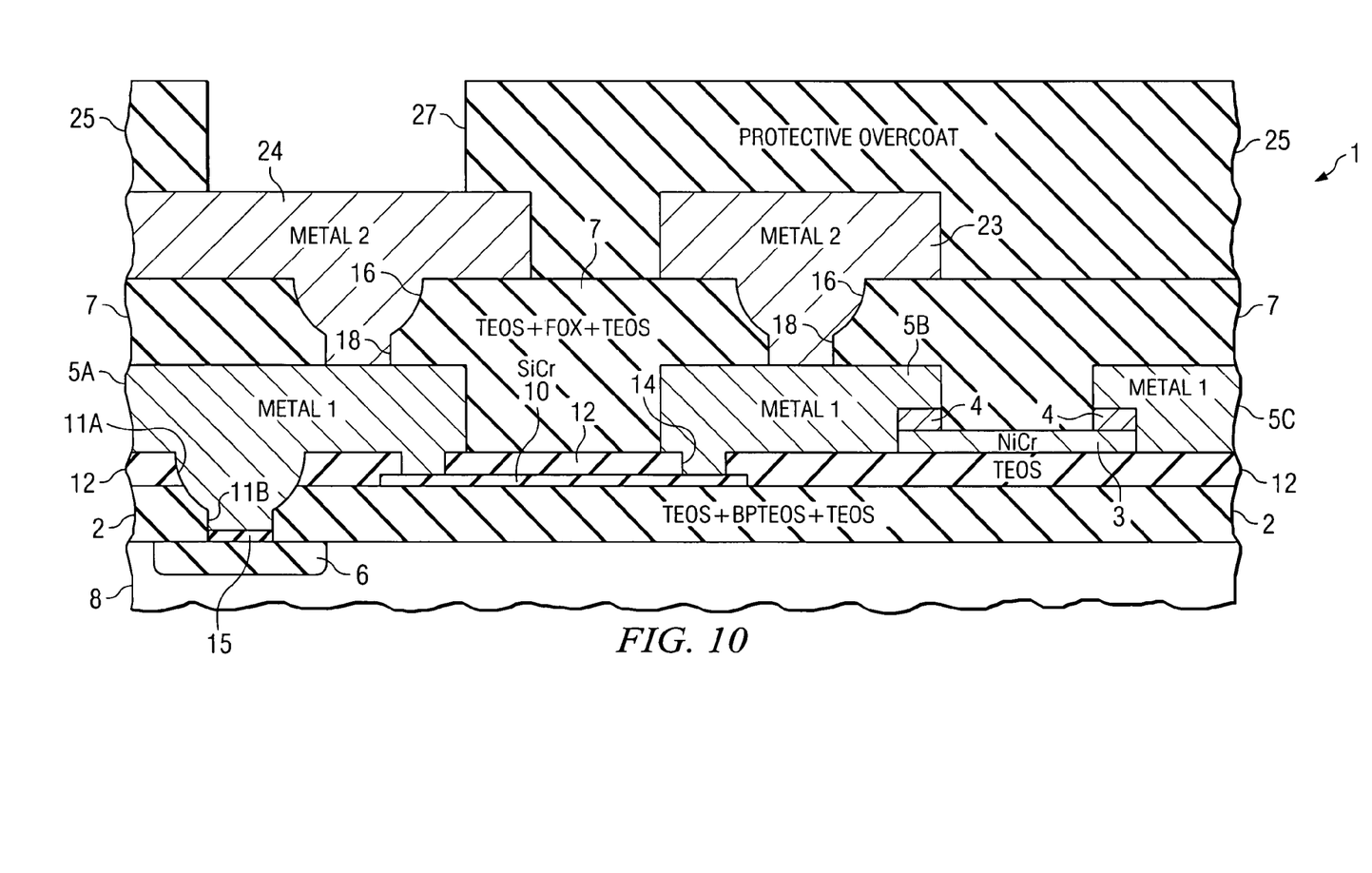

Referring to FIG. 10, the next step is to deposit (or spin on) a protective passivation layer 25, which may be SiON (silicon oxynitride), followed by a photoresist and etching procedure to define bonding pad openings such as opening 27, to provide the integrated circuit thin film resistor structure 1 shown in FIG. 10.

An advantage of the structure shown in FIG. 10 is that nichrome resistors can be readily laser trimmed with high accuracy, and the sichrome resistors can be matched with a high degree of precision. (The sichrome resistors also can be laser trimmed with relatively high accuracy, although the high accuracy can be accomplished only with the penalty of sichrome resistor area being increased according to the ratio of the sichrome sheet resistance relative to the nichrome sheet resistance.) This allows the integrated circuit designer increased flexibility by providing two options in selecting the desired thin film resistor component which is best for particular aspects of the circuit design, rather than being limited to use of thin film resistors of only a single available sheet resistance which is optimal in one part of the circuit but is not optimal in another part of the circuit. That is, the invention allows the design engineer to take advantage of two sheet resistances of thin film resistors within the same chip design so that various circuit design attributes can be optimized by using both types of resistors. This allows the designer to choose the best attributes of both types of thin film resistors as needed within the circuit design. The circuit designer does not have to compromise circuit performance as a result of having only one available resistor type. Sichrome alloy resistors of high sheet resistance can be selected if high resistance values, long-term stability, and resistor ratio matching are needed, and nichrome alloy resistors can be selected if low resistance values and good laser trimming capability are needed. For example, the nichrome resistors 3 are typically used for lower value resistors having sheet resistances in the range of 50 to 200 ohms per square, and can, for example, be very effectively tuned for RF termination resistors in RF circuitry.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, although various oxide layers are disclosed in the described embodiments, other dielectric layers, such as nitride layers, also can be used. The described structure could be modified by depositing nichrome (rather than sichrome) on pre-metal dielectric layer 2 and later depositing sichrome (rather than nichrome) on intermetal dielectric layer 7. Alternatively, the thin film resistors 3 on pre-metal dielectric layer 2 and the thin film resistors 10 on intermetal dielectric layer 7 could be composed of the same thin film material (which could be nichrome, sichrome, tantalum nitride, or other thin film material). Although thin film sichrome resistor 10 and thin film nichrome resistor 3 are shown as being formed before the deposition of the Metal 1 layer, in fact they could be formed before the deposition of any other subsequent interconnect metallization layer of the integrated circuit structure.

What is claimed is:

1. An integrated circuit structure comprising:
   (a) a first dielectric layer disposed on a semiconductor layer;
   (b) a first thin film resistor disposed on the first dielectric layer;
   (c) a second dielectric layer disposed on the first dielectric layer and the first thin film resistor;
   (d) a second thin film resistor disposed on the second dielectric layer;
   (e) a first layer of interconnect conductors disposed on the second dielectric layer including a first interconnect conductor contacting a first contact area of the first thin film resistor through a corresponding via opening, a second interconnect conductor contacting a second contact area of the first thin film resistor through a corresponding via opening, and a third interconnect conductor electrically contacting a first contact area of the second thin film resistor;
   (f) a third dielectric layer disposed on the second dielectric layer, the first layer of interconnect conductors and the second thin film resistor; and
   (g) a second layer of interconnect conductors disposed on the third dielectric layer including a fourth interconnect conductor extending through a corresponding opening in the third dielectric layer to contact the second interconnect conductor.

2. The integrated circuit structure of claim 1 including a circuit element disposed in the semiconductor layer, and a fifth interconnect conductor of the first layer of interconnect conductors extending through a corresponding opening in the first and second dielectric layers and contacting a contact area of the circuit element.

3. The integrated circuit structure of claim 2 wherein the fifth interconnect conductor is part of the first interconnect conductor.

4. The integrated circuit structure of claim 1 wherein the first thin film resistor is composed of sichrome.

5. The integrated circuit structure of claim 4 wherein the second thin film resistor is composed of nichrome.

6. The integrated circuit structure of claim 1 wherein at least one of the first and second thin film resistors is composed of one of the group including sichrome (SiCr), nichrome (NiCr) and tantalum nitride (TaN).

7. The integrated circuit structure of claim 1 including a circuit element disposed in the semiconductor layer, and a fifth interconnect conductor extending through a corresponding opening in the first and second dielectric layers and contacting a contact area of the circuit element, wherein the first thin film resistor is composed of sichrome and the second thin film resistor is composed of nichrome.

8. The integrated circuit structure of claim 7 including a metal silicide layer disposed between the fifth interconnect conductor and the contact area of the circuit element.

9. The integrated circuit structure of claim 8 wherein the first, second, and third dielectric layers are composed of oxide.

10. The integrated circuit structure of claim 9 wherein the nichrome has a sheet resistance in the range of 30 to 300 ohms per square and the sichrome has a sheet resistance in the range of 300 to 2000 ohms per square.

11. An integrated circuit structure made by the process including:
(a) forming a first dielectric layer on a semiconductor layer;
(b) forming a first thin film resistor on the first dielectric layer;
(c) forming a second dielectric layer on the first dielectric layer and the first thin film resistor;
(d) forming a second thin film resistor on the second dielectric layer;
(e) forming a first layer of interconnect conductors on the second dielectric layer including a first interconnect conductor contacting a first contact area of the first thin film resistor through a corresponding via opening, a second interconnect conductor contacting a second contact area of the first thin film resistor through a corresponding via opening, and a third interconnect conductor electrically contacting a first contact area of the second thin film resistor;
(f) forming a third dielectric layer on the second dielectric layer, the first layer of interconnect conductors, and the second thin film resistor; and
(g) forming a second layer of interconnect conductors on the third dielectric layer including a fourth interconnect conductor extending through a corresponding opening in the third dielectric layer to contact the second interconnect conductor.

12. The integrated circuit structure of claim 11 wherein the process includes forming a circuit element in the semiconductor layer and then forming the first dielectric layer on the semiconductor layer before step (a), wherein step (e) includes forming a fifth interconnect conductor of the first layer of interconnect conductors extending through a corresponding opening in the first and second dielectric layers to contact a contact area of the circuit element.

* * * * *